United States Patent [19]

Solie

[11] Patent Number: 4,635,008
[45] Date of Patent: Jan. 6, 1987

[54] DISPERSIVE SAW FILTER WITH TAPERED TRANSDUCERS

[75] Inventor: Leland P. Solie, Burnsville, Minn.

[73] Assignee: Sperry Corporation, New York, N.Y.

[21] Appl. No.: 799,719

[22] Filed: Nov. 19, 1985

[51] Int. Cl.[4] ............................................. H03H 9/64
[52] U.S. Cl. .................................. 333/195; 333/153; 333/154; 333/196; 310/313 D
[58] Field of Search ............................... 333/150–155, 333/193–196, 141–145; 29/25.35; 310/313 R, 313 A, 313 B, 313 C, 313 D

[56] References Cited

U.S. PATENT DOCUMENTS

| | | | |
|---|---|---|---|
| 3,568,102 | 3/1971 | Tseng | 333/153 |
| 3,753,164 | 8/1973 | De Vries | 333/153 |
| 3,975,697 | 8/1976 | Paige | 310/313 D X |
| 4,166,228 | 8/1979 | Solie | 310/313 D |
| 4,477,784 | 10/1984 | Maerfeld et al. | 333/154 |
| 4,521,751 | 6/1985 | Riha et al. | 333/151 |

OTHER PUBLICATIONS

N. J. Slater and C. K. Campbell, Improved Modeling of Wide-Band Linear Phase SAW Filters Using Transducers with Curved Fingers, IEEE Transactions on Sonics & Ultrasonics, vol. Su-31, No. 1, Jan. 1984, pp. 46–50.

P. M. Naraine and C. K. Campbell, Wide Band Linear Phase SAW Filters Using Apodized Slanted Finger Transducers, 1983 IEE Ultrasonics Symposiu, pp. 113–116.

*Primary Examiner*—Marvin L. Nussbaum
*Attorney, Agent, or Firm*—Glenn W. Bowen

[57] ABSTRACT

A dispersive Surface Wave Acoustic (SAW) filter is provided by a dispersive reflective array, and input and output transducers that we aligned with respect to the array so that the angle of incidence of a SAW from the input transducer is approximately equal to the angle of reflection from the reflective array over the entire range of the dispersive array, wherein the transducers are constructed to provide a frequency response which is matched to the periodicity of the dispersive array. Such design may be accomplished by forming the transducers with hyperbolically curved electrode fingers. The transducers may consist of relatively narrower inner electrode fingers and relatively wider outer electrode fingers. The transducers may also be divided into a plurality of tracks with each of the tracks being subdivided into a plurality of subtransducer elements which are capacitively coupled in electrical series.

3 Claims, 5 Drawing Figures

DISPERSIVE SAW FILTER WITH TAPERED TRANSDUCERS

BACKGROUND OF THE INVENTION

The present invention relates to Surface Acoustical Wave (SAW) filters and, in particular, to a dispersive filter which employs a tapered transducer and a dispersive reflective array. The array has an electrode pattern which reduces insertion loss and electrode resistance which allows the electrodes to be connected in series electrically, in order to raise the acoustic impedance of the device.

Dispersive filters are useful in applications such as radar, or sonar, and in some nondestructive testing applications, where a transmitter emits a short pulse which is reflected from an object and returned to a receiver. Since the returning pulse is a function of the reflections from both the object under consideration and the surrounding environment and also noise signals, early systems of the pulse echo type used a high power, short duration pulse to obtain good range resolution and a high signal-to noise ratio. This imposed severe limitations on transmitter components.

Subsequent pulse echo ranging systems were developed which used a long duration signal of a relatively low peak power, and derived a narrow pulse signal through a matched filter at the receiver input. One type of such a matched filter is designed to provide a rising time delay versus frequency characteristic, whereby high frequencies are delayed for a greater period of time than are low frequencies. When a signal is applied to such a filter in which high frequencies occur at the beginning of the waveform, and lower frequencies occur toward the end of the waveform, compression of the signal will occur, and the duration of the compressed pulse will be less than the duration of the input waveform. This type of filter is commonly called an "up-chirp" filter because the time delay increases with frequency. Similar filters whereby the time delay decreases with frequency increase are known and are called "down-chirp" filters.

Dispersive transducers have been developed with an apodized structure wherein the input and output transducers are located along a line, and either signal expansion or signal compression can be achieved through proper design of the device. An example of a "two-bounce" SAW device which utilizes reflected acoustic waves is shown in U.S. Pat. No. 4,521,751 issued June 4, 1985 to Gerd Riha and Richard Veith, in which the input and output transducers are located side by side and two reflective arrays consisting of a series of angled reflective line elements or gratings are aligned so waves emitted from the input transducer bounce off of both of the reflective arrays back to the output transducer. One problem with a two-bounce reflective array is that a substantial portion of the delay path of a two-bounce device is in the reflective gratings, which results in a less efficient, or higher loss, device. In addition the two-bounce configuration results in a narrower allowable bandwidth due to a higher scattering loss into bulk modes, and bandwidth limitations of the transducers.

A Surface Acoustic Wave filter is shown in U.S. Pat. No. 3,753,164 issued Aug. 14, 1973 to Adrian J. DeVries. In this device the input transducer and output transducer were aligned with respect to an equally-spaced, multi-line, reflective array so that the angle between a normal to the input transducer and the reflector is equal to the angle between a normal to the output transducer and the reflector. This configuration was employed in combination with a separate dispersive element, which was located behind the reflective array, to minimize the response of the output transducer to bulk waves.

A dispersive SAW filter is also known in the prior art in which the input and the output transducers were aligned similar to the alignment of the DeVries device, but the reflective array had a nonlinear displacement function so that the elements of the array which are closer to the transducers were more closely spaced than those which were further removed from the transducers. The input and output transducers of this device, because of their constant periodicity, were responsive only to a relatively narrow bandwidth. Although the array was dispersive because its periodicity changed continuously along the array, only a small portion of the array was effective in reflecting usable signals, since other portions of the array were either too narrowly, or too widely, spaced to reflect the entire bandwidth coherently.

Another line of development, which is concerned with wide-band delay lines in which SAW filters using slanted finger transducers were developed, is described in "Wide Band Linear Phase SAW Filters Using Apodized Slanted Finger Transducers" by P. M. Naraine and C. K. Campbell in the 1983 *IEEE Ultrasonic Symposium Proceedings*, pages 113-116. The slanted finger interdigital transducer structure described in this article employed straight slanted fingers which emanated from a common focal point, in an effort to yield a flat amplitude response across a passband. Apodization of the device was derived from a computer optimization routine to compensate for the inherent negative amplitude slope of an unapodized slanted finger transducer, so that the external amplitude equalization circuits were not needed.

A subsequent article entitled "Improved Modeling of Wide-Band Linear Phase SAW Filters Using Transducers with Curved Fingers" by N. J. Slater and C. K. Campbell was published in the *IEEE Transactions on Sonics and Ultrasonics*, Vol. SU-31, No. 1, January 1984, pages 46-50. The authors of this work describe a wide band linear phase SAW filter in which slanted fingers, such as those shown in the Naraine and Campbell article have been curved to obtain a flatter frequency response for delay line applications.

The present invention involves the use of transducers with curved fingers which are, in particular, hyperbolically tapered in conjunction with a dispersive reflective array to provide an improved SAW dispersive filter. The transducers of the present invention also utilize configurations which reduce the insertion loss and allow for the acoustic impedance to be increased by a unique finger design.

SUMMARY OF THE INVENTION

A dispersive filter is provided in which hyperbolically tapered input and output transducers are aligned so that normals from the transducers to the dispersive reflective array are aligned at substantially at the same angle. The transducers are provided with fingers with electrode configuration paths which are subdivided into defined patterns in order to segment the acoustic beam width, and to subdivide the structure into a plurality of subtransducers.

BRIEF DESCRIPTION OF THE DRAWINGS

The present invention is illustrated by reference to the drawings in which.

TECHNICAL DESCRIPTION OF THE INVENTION

Figure 1:
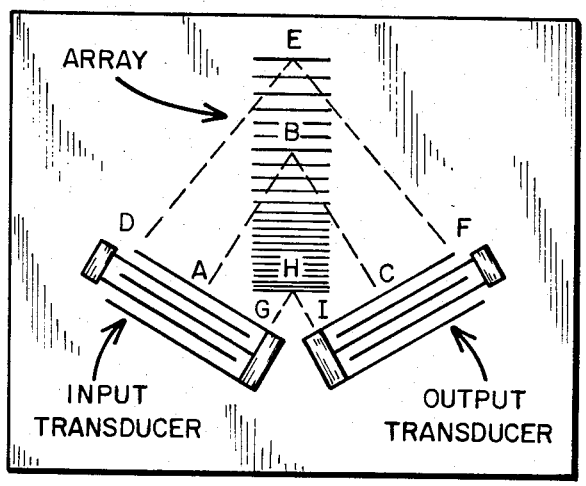
FIG. 1 is a representation of a prior art dispersive reflective SAW filter which employed input and output transducers of a constant periodicity.

Referring to the prior art of FIG. 1, there is shown therein a dispersive reflective array SAW filter in which transducers of a conventional type, with parallel interdigital electrode fingers, are employed as the input and output transducers. The dispersive reflective array consists of a number of parallel lines that may be formed either by depositing metal conductive strips, or by trenches or grooves, formed in the substrate on which the transducer array rests. Because of the constant spacing between the interdigital fingers of the transducers of FIG. 1, a relatively narrow band of frequencies will be generated by the input transducer and received by the output transducer.

The lines A, B, C represents a wave which passes from the input transducer at A to the reflective array at B and is then bounced off and supplied to the output transducer at C. This waveform represents a wave which is within the receiving band capabilities of the output transducer. The waves represented by the lines D, E, F and G, H, I are, respectively, too low and too high in frequency to be coherently reflected by the array. Only a small fraction of the acoustic beam aperture will be reflected toward the output transducer. As this narrow aperture beam arrives at the output transducer only a small fraction of its energy can be detected by the transducer because of the mismatch in beam widths. Thus, although all of the frequency spectrum of the wave that was generated by the input transducer was incident upon the entire reflective array, only a limited amount of the incident waveform is recovered by the output transducer. This results in an unacceptably large insertion loss.

Figure 2:
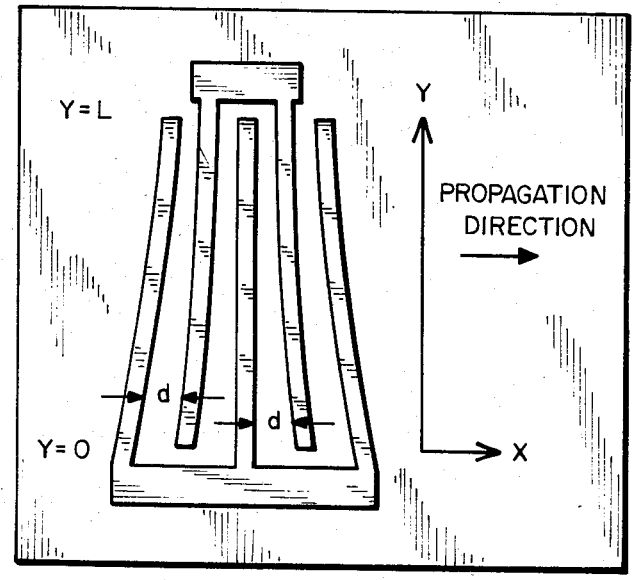
FIG. 2 is a representation of a prior art tapered transducer.

The prior art transducer illustrated in FIG. 2, is a tapered transducer with curved electrodes in which the spacings between the fingers of one electrode section and the fingers of the other electrode section is a function of the length, or Y, position along the fingers and is independent of the X, or propagation direction. Therefore, for each Y position the transducer will be phased matched, or resonant, with a SAW whose wavelength is equal to twice the distance d. The frequency of the SAW will, therefore, be equal to the velocity of the wave divided by 2d. The range of frequencies that may be launched by the transducer will, thus, range between the velocity of the wave, or V, divided by twice the maximum d; and the velocity of the wave divided by twice the minimum d. As seen in FIG. 2 the maximum value of d occurs at $Y=0$, and the minimum value at $Y=L$. Different frequencies will then be launched at different points along the transducer in accordance with the value d across the length of the transducer at a given Y position.

The tapered electrode transducer of the present invention is constructed so that if the frequency of the transducer varies linearly with delay time, as it will for an FM filter, then the SAW frequencies will vary linearly across the transducer going from $Y=0$ to $Y=L$. Since the launched frequencies are proportional to their originating Y position, then Y will be proportional to 1/d. In other words, the electrode lines of the transducer of the present invention will be segments of hyperbolas for linear FM filter operations, and the frequency of the filter will vary linearly across the bandwidth.

Figure 3:
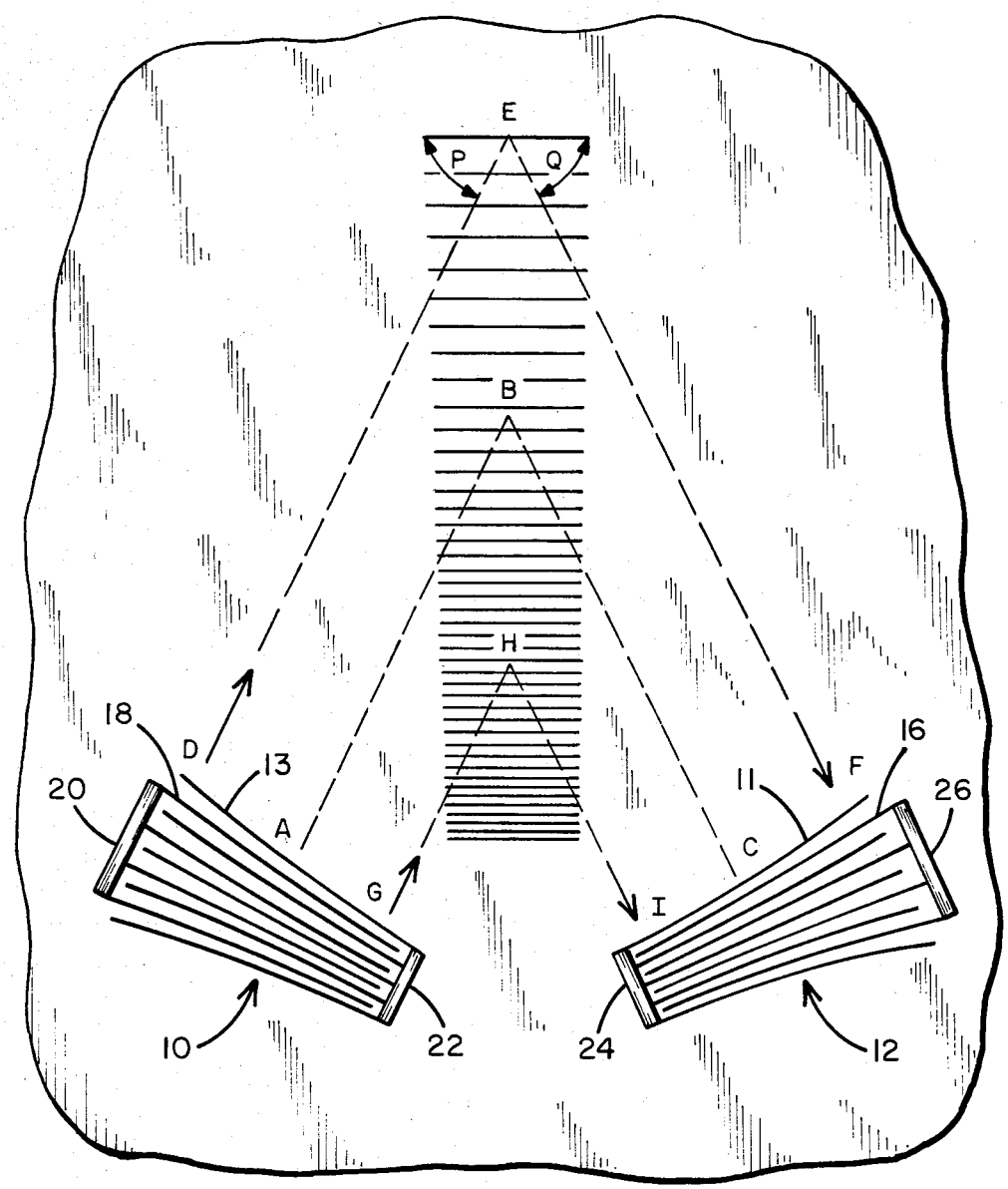
FIG. 3 is representation of a first embodiment of a dispersive SAW filter which employs a dispersive reflective array and hyperbolically tapered input and output transducers.

A combination of a hyperbolically tapered transducer and a dispersive reflective array constructed in accordance with the present invention is shown in FIG. 3, in which the input transducer 10 and the output transducer 12 are aligned so that the angle of the incidence of the incoming waves from the input transducer 10, such as the angle P, will be equal to the angle of reflection, such as the angle Q, to the output transducer 12. As shown in the Figure, the distance between the fingers 13, which are attached to the short electrode 22, and the fingers 18, which are attached to the long electrode 20, are spaced closer together as they approach the short electrode and are spaced farther apart toward the long electrode.

The intermediate frequencies of the input transducer will thus be reflected from the dispersive array along the lines A, B, C to the output transducer in the manner of the prior art. However, in the filter of FIG. 3, because of the matching curvature of the input and output transducers, the low frequency waves will not be developed along the entire transducer but only along the proportion of the transducer which is proximate the longer electrode 20. The spacing of the fingers of the output transducer with respect to the short electrode 24 and the long electrode 26 of the output transducer 12 is matched with that of the input transducer 10. The lower frequency waves produced by the input transducer will, therefore, be reflected along the path D, E, F and will be received without substantial loss by the output transducer 12.

In a similar manner, the high frequency signal generated in the vicinity of the shorter electrode 22 of the input transducer 10 and will be provided along the path G, H, I to the output transducer 12, where they are again received without substantial loss. Thus, the embodiment in FIG. 3 provides an improved dispersive filter with a lower loss and a wider bandwidth.

Figure 4:
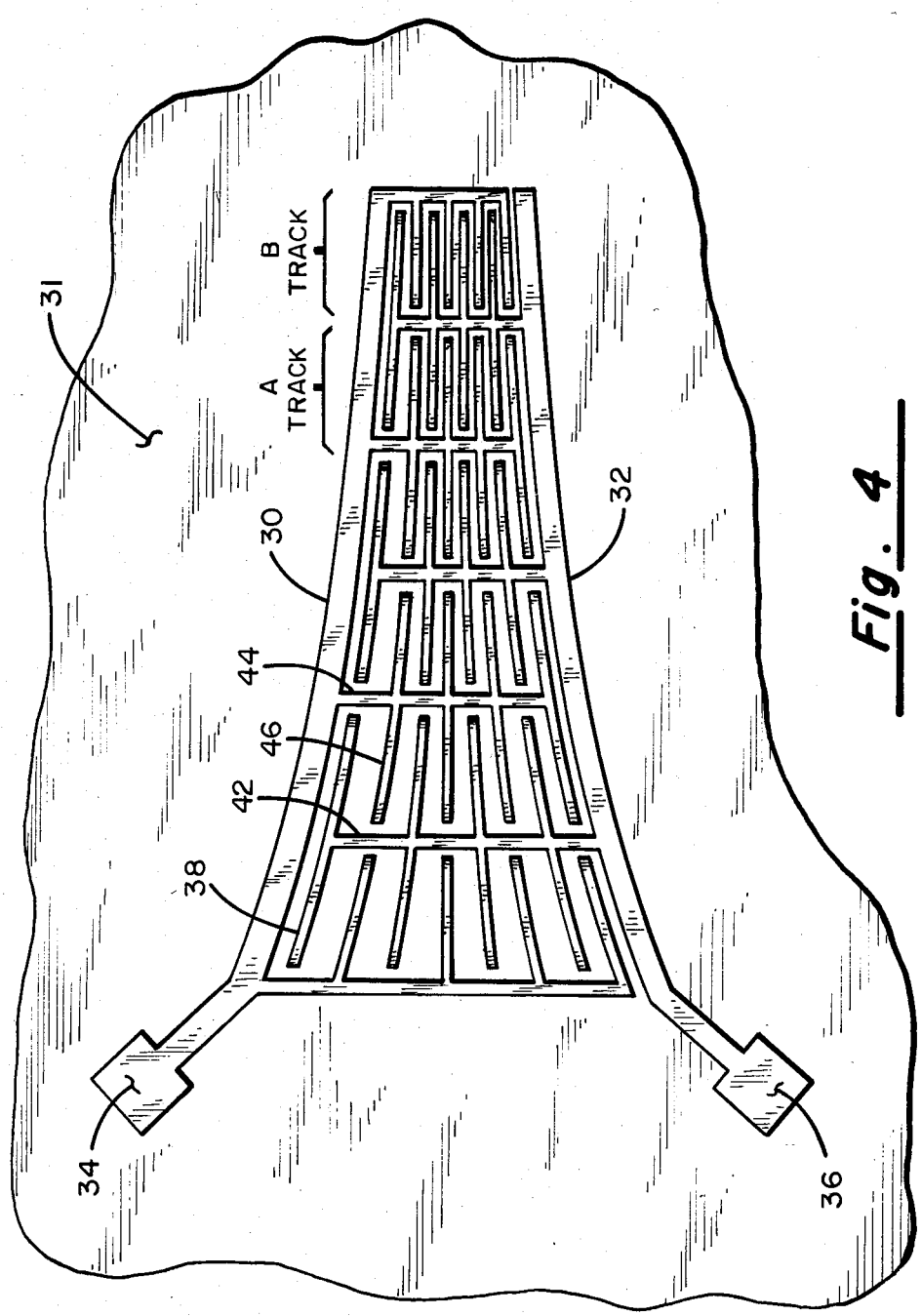
FIG. 4 illustrates the construction of a transducer of a second embodiment of the present invention.

FIG. 4 shows a further improvement to the transducers with hyperbolic shaped electrode fingers of FIG. 3 which may be utilized when it is necessary to further reduce the insertion loss for such transducers. This modification involves the segmenting of the fingers of the transducer so that only the two outer, widened electrode fingers 30 and 32, (on a suitable substrate 31, such as a piezoelectric acoustic-wave-propagating medium, or other substrate known to be suitable for the purpose) connect to the opposite electrode pads 34 and 36 respectively, and extend along the entire length of the transducer. The remaining inner electrodes, such as the electrodes 38 and 46, extend along only a portion of the outer fingers 30 and 32, and are connected to their respective outer fingers through crossbeams, such as the crossbeams 42, 44. By segmenting the inner electrode segments, and by increasing the width of the outer electrodes 30 and 32, a decrease in electrode resistance is obtained which allows the width of the inner electrodes to be sufficiently narrow to produce a transducer which does not have substantially different acoustic impedance than the transducer of FIG. 3. The electrical parasitic resistance, however, is approximately decreased by $N^2$ over this transducer, where N is the number of segments, such as the electrode 38 into which each finger electrode is divided. For example, in the embodiment shown in FIG. 4 where there are six segments, the electrode resistance will be approximately 1/36 of the resistance of the transducer shown in FIG. 3.

Figure 5:
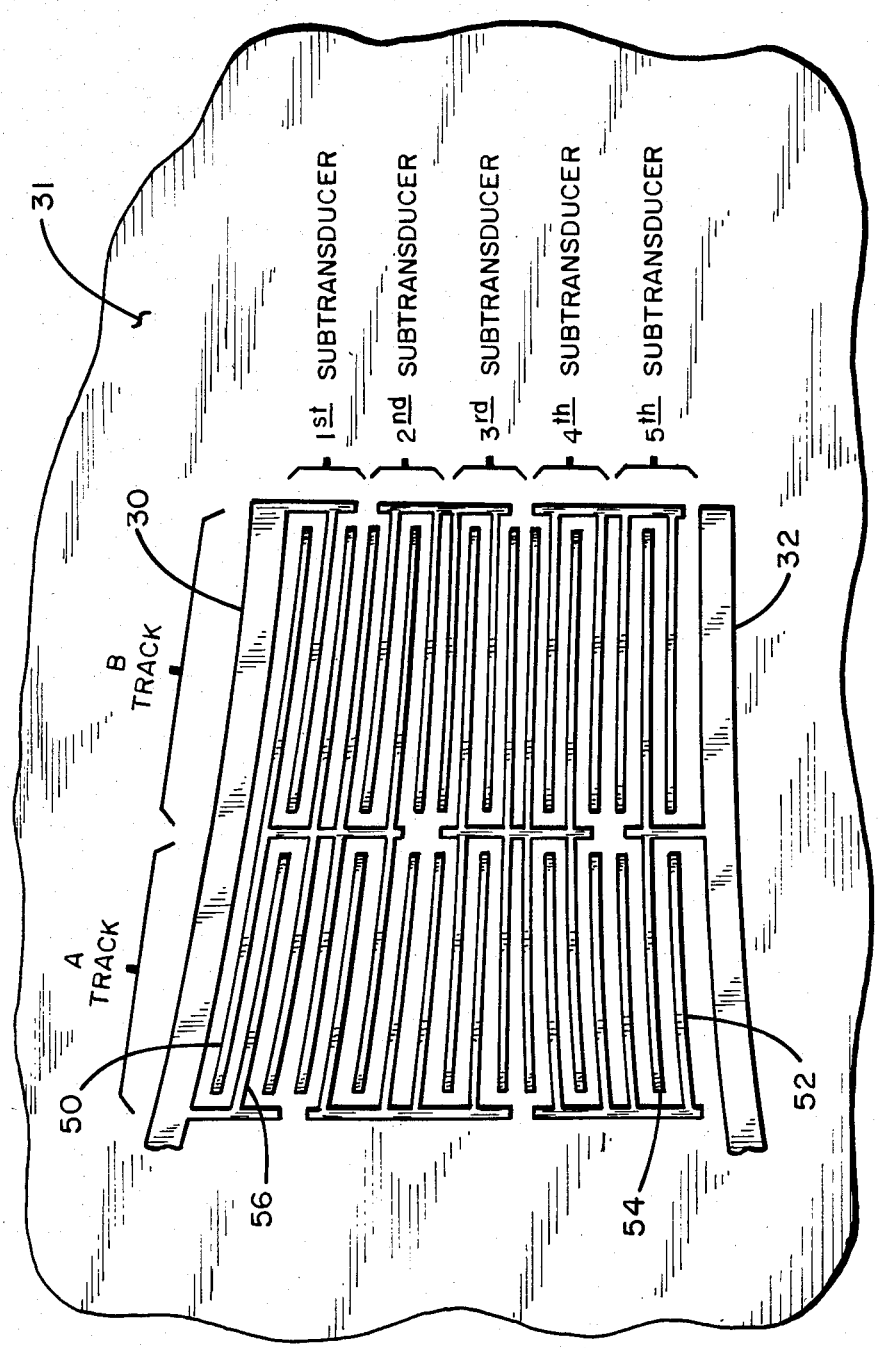
FIG. 5 illustrates a pair of segments of the transducer of FIG. 4, which form a further embodiment of the present invention.

FIG. 5 shows another modification in which each segment of the transducer may be subdivided to provide a number of subtransducers across the outer electrodes. The showing of FIG. 5, for simplification, illustrates only two tracks of the transducer, which correspond to the tracks between the lines A and B of FIG. 4. Interconnections in these tracks provides a number of capacitively coupled, floating electrode subtransducers. For example FIG. 5, there are five subtransducers in each track which are connected in series to provide a voltage dividing path between the electrodes 30, 32. For example, capacitive coupling occurs between sections 30 and 50, 32 and 52, 52 and 54, 50 and 56, etc., of FIG. 5. Although the electrodes of the transducer of FIG. 5 are very thin the fringing effect of electric fields are to opposite polarity connections to the adjacent electrode sections provides the desired capacitive coupling through the under lying substrate. The acoustic impedance is thus increased by factor $N^2$, where N is the number of subtransducers of each track, over the acoustic impedance of the transducer of FIG. 4. Thus, in the illustrated embodiment of FIG. 5 the acoustic impedance in increased by a factor of 25, as compared to a transducer with the same number of electrodes but with only one subtransducer per segment as in FIG. 4.

Although changes and modifications may be proposed by those skilled in the art, all such changes or modifications that do not depart from the teachings of this invention are intended to be included within the scope of the invention.

What is claimed is:

1. In a dispersive single bounce Surface Acoustic Wave (SAW) filter comprising a dispersive reflective array comprising a series of parallel reflectors, an input transducer for producing a SAW and an output transducer for receiving a SAW, wherein said transducers are symmetrically aligned with respect to said array so that the angle of incidence of a SAW from said input transducer is substantially equal to the angle of reflection of said SAW from said reflective array to said output transducer over the entire range of said dispersive reflective array, the improvement wherein said transducers each comprise first and second electrodes, each of which comprise a plurality of curved interdigital electrode fingers that are each formed as segments of hyperbolic curves positioned such that the spacing between said fingers varies from point-to-point along said transducer and the spacing between said fingers is substantially constant at any given point in order to provide a frequency response which is matched to the periodicity of said dispersive array.

2. In a dispersive single bounce Surface Acoustic Wave (SAW) filter comprising a dispersive reflective array comprising a series of parallel reflectors, an input transducer for producing a SAW and an output transducer for receiving a SAW, wherein said transducers are symmetrically aligned with respect to said array so that the angle of incidence of a SAW from said input transducer is substantially equal to the angle of reflection of said SAW from said reflective array to said output transducer over the entire range of said dispersive reflective array, the improvement wherein said transducers each comprise first and second electrodes, each of which comprise a plurality of curved interdigital electrode fingers that are each formed as segments of hyperbolic curves positioned such that the spacing between said fingers varies from point-to-point along said transducer and the spacing between said fingers is substantially constant at any given point in order to provide a frequency response which is matched to the periodicity of said dispersive array the improvement wherein said curved electrode fingers comprise a pair of outer electrode fingers and a plurality of inner electrode fingers, said outer electrode fingers are relatively wider than said inner electrode fingers, said inner electrode fingers are subdivided into a plurality of hyperbolic curved sections, and said transducers comprise interconnection electrode connection means for connecting each of said sections to one of said outer electrode fingers.

3. In a SAW filter as claimed in claim 2 the improvement wherein said transducers are each divided into a plurality of tracks, and each of said tracks is subdivided into a plurality of subtransducer elements which comprise floating electrode fingers which are not connected to either of said outer electrode fingers but which are configurated so they capacitively couple subtransducers that are a given track in electrical series.

* * * * *